(12) United States Patent
Lan et al.

(10) Patent No.: US 11,577,480 B2
(45) Date of Patent: Feb. 14, 2023

(54) METHOD AND APPARATUS FOR MASS PRODUCTION OF AR DIFFRACTIVE WAVEGUIDES

(71) Applicants: QINGDAO UNIVERSITY OF TECHNOLOGY, Qingdao (CN); QINGDAO 5D INTELLIGENT ADDITIVE MANUFACTURING TECHNOLOGY CO., LTD., Qingdao (CN)

(72) Inventors: Hongbo Lan, Qingdao (CN); Quan Xu, Qingdao (CN); Jiawe Zhao, Qingdao (CN); Xiaoyang Zhu, Qingdao (CN)

(73) Assignees: QINGDAO UNIVERSITY OF TECHNOLOGY, Qingdao (CN); QINGDAO 5D INTELLIGENT ADDITIVE MANUFACTURING TECHNOLOGY CO., LTD., Qingdao (CN)

( * ) Notice: Subject to any disclaimer, the term of this patent is extended or adjusted under 35 U.S.C. 154(b) by 361 days.

(21) Appl. No.: 16/930,387

(22) Filed: Jul. 16, 2020

(65) Prior Publication Data
US 2021/0197507 A1    Jul. 1, 2021

(30) Foreign Application Priority Data
Dec. 25, 2019    (CN) .......................... 201911356801.0

(51) Int. Cl.
*B29D 11/00*    (2006.01)
*B33Y 10/00*    (2015.01)
(Continued)

(52) U.S. Cl.
CPC .... *B29D 11/00663* (2013.01); *B29C 33/3842* (2013.01); *B29C 59/022* (2013.01);
(Continued)

(58) Field of Classification Search
CPC ....... B29D 11/00663; B29L 2011/0075; B29C 43/08; B29C 2043/3678; B29C 2043/3676; B29C 64/10; B33Y 10/00; C25D 1/10
See application file for complete search history.

(56) References Cited

U.S. PATENT DOCUMENTS

| | | | |
|---|---|---|---|
| 2004/0126694 A1* | 7/2004 | Devoe | G02B 6/1221 430/321 |
| 2021/0016496 A1* | 1/2021 | Chen | B29C 64/129 |

FOREIGN PATENT DOCUMENTS

| | | | |
|---|---|---|---|
| CN | 101205054 A | * | 6/2008 |
| CN | 105034344 A | * | 11/2015 |

(Continued)

OTHER PUBLICATIONS

English translation of CN-110244393-A by EPO (OA Appendix) (Year: 2019).*

(Continued)

*Primary Examiner* — Leith S Shafi
*Assistant Examiner* — Inja Song
(74) *Attorney, Agent, or Firm* — Oliff PLC (57) ABSTRACT

A method and apparatus for mass production of AR diffractive waveguides. Low-cost mass production of large-area AR diffractive waveguides (slanted surface-relief gratings) of any shape. Uses two-photon polymerization micro-nano 3D printing to realize manufacturing of slanted grating large-area masters of any shape (thereby solving the problem about manufacturing of slanted grating masters of any shape on the one hand, realizing direct manufacturing of large-size wafer-level masters on the other hand, and also having the advantages of low manufacturing cost and high production efficiency). Composite nanoimprint lithography technology is employed (in combination with the peculiar imprint technique and the composite soft mold suitable for (Continued)

slanted gratings) to solve the problem that a large-slanting-angle large-slot-depth slanted grating cannot be demolded and thus cannot be manufactured, and realize the manufacturing of the slanted grating without constraints (geometric shape and size).

8 Claims, 4 Drawing Sheets

(51) Int. Cl.
- *B29C 64/10* (2017.01)
- *B29C 33/38* (2006.01)
- *B29C 59/02* (2006.01)
- *C25D 1/10* (2006.01)
- *F21V 8/00* (2006.01)
- *G03F 7/00* (2006.01)
- *B33Y 50/02* (2015.01)
- *B29C 64/393* (2017.01)

(52) U.S. Cl.
CPC ............ *B29C 64/10* (2017.08); *B29C 64/393* (2017.08); *B33Y 10/00* (2014.12); *B33Y 50/02* (2014.12); *C25D 1/10* (2013.01); *G02B 6/0038* (2013.01); *G02B 6/0065* (2013.01); *G03F 7/0002* (2013.01); *B29K 2905/08* (2013.01)

(56) References Cited

FOREIGN PATENT DOCUMENTS

| | | | | | |
|---|---|---|---|---|---|
| CN | 108162425 | A | * | 6/2018 | ............ B29C 39/02 |
| CN | 108762001 | A | * | 11/2018 | ............ B82Y 40/00 |
| CN | 110244393 | A | * | 9/2019 | ......... G02B 27/0172 |

OTHER PUBLICATIONS

English translation of CN-101205054-A by EPO (OA Appendix) (Year: 2008).*
English translation of CN-108762001-A by EPO (OA Appendix) (Year: 2018).*
A Blog of Laser Focus World ("High-speed laser wafer scribing," available at https://www.laserfocusworld.com/industrial-laser-solutions/article/14216298/highspeed-laser-wafer-scribing, available in public on Apr. 1, 2005) (Year: 2005).*
English translation of CN-108162425-A by EPO (OA Appendix) (Year: 2018).*
English translation of CN-105034344-A by EPO (OA Appendix) (Year: 2015).*

* cited by examiner

METHOD AND APPARATUS FOR MASS PRODUCTION OF AR DIFFRACTIVE WAVEGUIDES

BACKGROUND

Technical Field

The present disclosure belongs to the technical fields of augmented reality (AR), micro-nano manufacturing and additive manufacturing (3D printing), and particularly relates to a method and apparatus for mass production of AR diffractive waveguides, in particular to a method and apparatus capable of realizing low-cost mass production of large-area AR diffractive waveguides (slanted surface-relief gratings) of any shape.

Related Art

The statements in this section merely provide background information related to the present disclosure and do not necessarily constitute the prior art.

Augmented reality (AR for short) is a new technology that cleverly combines virtual information with the real world. By integrating multiple technologies such as multimedia, three-dimensional modeling, real-time tracking and registration, intelligent interaction, sensing and the like, the computer-generated text, images, three-dimensional models, music, videos and other virtual information are simulated and applied to the real world, so that the two kinds of information complement each other, thereby realizing "augmentation" of the real world.

AR glasses (helmet-mounted display) are the core functional component of an augmented reality system. Unlike virtual reality (VR) where the user's vision is blocked, users in augmented reality (AR) can observe the real world and the virtual world at the same time. Therefore, AR glasses need to have a see-through function to see both the real outside world and virtual information. The AR glasses usually need to be provided with an optical coupler or a group of optical couplers so that virtual information and real scenes are integrated by "superimposing" to complement each other and "augment" each other. The optical display system of the AR glasses is typically composed of micro display screens and optical elements. The display systems employed in the AR glasses currently on the market are basically a combination of various micro display screens and optical elements such as prisms, freeform surfaces, waveguides and the like. Among them, the waveguides are considered to be the most ideal solution for AR glasses to consumer grade. AR waveguides are classified into geometric waveguides and diffractive waveguides. A geometric waveguide is an arrayed waveguide, which realizes the output of the image and the expansion of the eyebox through the stack of the array mirrors. In the geometric waveguide, each mirror in the mirror array needs to be coated with multiple layers of films with different reflection/transmission (R/T) ratios to achieve uniform light output from each exit pupil, so the production technique is cumbersome and the overall yield is low. From the technical solutions employed by the current AR glasses international companies, diffractive waveguides have shown better and wider industrial application prospects.

A diffraction grating is the core of the diffractive waveguide. Depending on different diffraction gratings used, diffractive waveguides mainly include surface relief gratings and volume holographic gratings. The volume holographic gratings are complex in material preparation and difficult for mass production, and it is difficult to ensure the long-term reliability and material stability. The consensus that has been formed in the industry is that the surface relief gratings are currently the best solution for the AR glasses to have an appearance of common glasses and to enter the consumer market in deed.

Figure 1A:
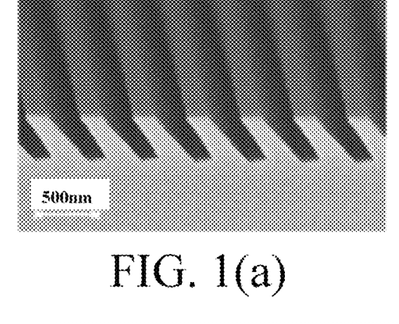
FIG. 1(a) and FIG. 1(b) show schematic diagrams of a slanted surface-relief grating diffractive waveguide.

The rectangular grating structure typically used by the surface relief grating wastes half of the light. Compared with the rectangular grating diffraction structure, a slanted grating (as shown in FIG. 1 (a)) or a triangular blazed grating can maximize the coupling efficiency of light diffracted toward the eyes. However, existing micro-nano manufacturing technologies (such as optical lithography, nanoimprint, laser interference lithography and the like) have difficulties in manufacturing diffraction slanted gratings, and especially the challenge of achieving low-cost mass production of slanted gratings.

It is known by the inventors that the current method for producing surface relief gratings in an AR apparatus includes the steps that (1) electron beam lithography and an etching technique are used to manufacture small masters, and a step imprinting technique is used to manufacture a large master (imprinting mold); and (2) then a slanted grating waveguide structure is imprinted on a glass substrate (waveguide sheet) coated with a resin material having very high visible band transparency and high refractive index by nanoimprint (platen technique). This solution faces great limitations and constraints in the manufacture of master molds and the manufacture of slanted grating waveguides. For example, the combination of the electron beam lithography and the etching technique can only manufacture masters with very small area, can only define certain geometric feature dimensions (small slant angle, small slot depth and the like) for the manufactured slanted gratings, and especially has the problems of high manufacturing cost and long production cycle. In addition, the existing nanoimprint technology is only suitable for slanted grating structures with small slant angles and small slot depths. Slanted gratings with large slant angles and large slot depths have difficulty in demolding, or are even impossible to demold and cannot be manufactured at all. Moreover, there are also problems such as small imprint area, easy damage to the mold, many demolding defects and the like. Therefore, there are difficult problems in both design and mass production of slanted gratings.

SUMMARY

In order to solve the above problems, the present disclosure provides a method and apparatus for mass production of AR diffractive waveguides. The present disclosure can realize low-cost mass production of large-area AR diffractive waveguides (slanted surface-relief gratings) of any shape.

According to some embodiments, the present disclosure adopts the following technical solution:

Firstly, a method for mass production of AR diffractive waveguides is provided. The method includes the following steps:

(1) manufacturing of a polymer master: manufacturing a polymer master by using two-photon polymerization micro-nano 3D printing;

(2) manufacturing of a metal master mold: manufacturing a slanted grating metal nickel master mold by using the polymer master manufactured in step (1) in combination with precision micro electroforming technology;

(3) manufacturing of a working soft mold: determining support layer and pattern layer materials, and using a working soft mold copying apparatus to perform mass copying of the working soft mold by using the slanted grating metal nickel master mold manufactured in step (2) as a mold;

(4) manufacturing of a slanted surface-relief grating by composite nanoimprint lithography: selecting an imprinting material and an imprinting substrate, using the working soft mold prepared in step (3) as an imprinting mold, and using composite nanoimprint technology, where during mold covering, a mold covering direction of the working soft mold (a rotation direction of an auxiliary roller) being opposite to a direction of the slanted grating on the working soft mold is ensured such that the slanted grating structure is imprinted, transferred and copied onto the imprinting material forwardly; during imprinting, two-time imprinting method is used, and an imprinting direction of the two-time imprinting (the rotation direction of the auxiliary roller) is opposite to a slanting direction of the slanted grating on the working soft mold; during demolding, "peeling" demolding is used, and a demolding direction (the rotation direction of the auxiliary roller) is the same as the direction of the slanted grating on the working soft mold, thereby completing manufacturing of the wafer-level slanted grating; and (5) cutting the manufactured wafer-level slanted surface-relief grating into the slanted surface-relief grating required for AR glasses by laser scribing technology, thereby completing manufacturing of the AR diffractive waveguide.

In the above technical solution, firstly, the two-photon polymerization micro-nano 3D printing technology is used to realize fast low-cost manufacturing of the slanted surface-relief grating master of any geometric shape. On the one hand, the problem about manufacturing of the slanted grating master of any shape is solved, and on the other hand, the large-size wafer-level master can be directly manufactured. Moreover, the above technical solution has the advantages of low manufacturing cost and high production efficiency.

Secondly, by combining the metal master mold copying and the working soft mold manufacturing apparatus, the problems (the working soft mold is short in service life and needs to be replaced frequently, thereby realizing fast manufacturing on the one hand and ensuring low-cost manufacturing on the other hand) in mass production of working soft molds are solved.

Finally, the composite nanoimprint lithography technology is used. During the mold covering, the mold covering direction of the working soft mold is opposite to the direction of the slanted grating on the working soft mold, so that a small force can be employed to ensure that the slanted grating on the working soft mold is pressed into the imprinting material, and at the same time, the slanted grating on the working soft mold is protected, thereby avoiding the problem that the working soft mold is damaged and cannot be completely pressed into the imprinting material easily due to vertical pressing or reverse pressing. During the imprinting, the two-time imprinting method is used, and the method of performing dislocated rotation on the roller is used to reduce the adverse effect caused by the adsorption slot and ensure that the working soft mold is in complete conformal contact with the substrate under the uniform pressing of the roller. During the two-time imprinting, the rotation direction of the roller is opposite to the slanting direction of the slanted grating on the working soft mold, so that the working soft mold slanted grating can be completely filled with the imprinting material by using a very small imprinting force. On the one hand, the imprinting force is reduced, deformation of the working soft mold is reduced, and the imprinting accuracy and quality are improved; and on the other hand, the working soft mold is protected, its service life is prolonged, and especially the damage to the fragile glass substrate due to a too large imprinting force can be avoided. During the demolding, the working soft mold is separated from the imprinting substrate in the "peeling" manner. During the demolding, the rotation direction of the roller is the same as the direction of the slanted grating on the working soft mold. The problem that the traditional nanoimprint parallel demolding cannot realize demolding of the slanted grating structure is solved, and especially the demolding direction is the same as the direction of the slanted grating such that the working soft mold can be separated from the imprinting grating structure by using a very small demolding force. Moreover, demolding defects can be avoided, and the service life of the working soft mold is prolonged. The disclosed composite nanoimprint technique is used to solve the problem that a large-slanting-angle large-slot-depth slanted grating cannot be demolded and thus cannot be manufactured, and realize the manufacturing of the slanted grating without constraints (geometric shape and size). The requirement that AR glasses need to have a see-through function is met.

The steps complement each other to realize low-cost mass production of large-area AR diffractive waveguides (slanted surface-relief gratings) of any shape.

As an alternative implementation, after a first production cycle is completed, step (1), step (2) and step (3), and step (4) and step (5) run in parallel.

As an alternative implementation, step (1), step (2) and step (3) are in serial production; and step (4) and step (5) are in serial production.

As an alternative implementation, in step (1), the manufacturing of the polymer master specifically includes:

converting a geometric shape and a size of the designed slanted grating into a processing file by using data processing software; subsequently, inputting the processing file to a two-photon polymerization micro-nano 3D printer;

performing layer-by-layer printing according to design data until the printing of the entire slanted grating is completed; and taking the manufactured slanted grating off a printing platform of the printer, removing a supporting structure, and further performing post-curing treatment to prepare the slanted grating polymer master.

As an alternative implementation, in step (2), the method of manufacturing the metal master mold includes:

sputter-depositing a seed layer Cr/Cu on a surface of the slanted grating polymer master by using a slanted sputtering manner;

forming and copying the slanted grating nickel master mold by using a precision micro electroforming technique; and separating the slanted grating nickel master mold from the polymer master, completely removing the residual structure and material of the polymer master attached to the nickel master mold, and performing surface treatment on the nickel master mold slanted grating to reduce surface roughness and improve surface quality of the slanted grating.

As an alternative implementation, in step (3), the mass copying of the working soft mold specifically includes the following steps:

firstly applying a layer of a mold release agent to the metal master mold, then applying a layer of a liquid working soft mold pattern layer material by using a precision coating manner, placing the metal master mold coated with the pattern layer material on a carrying table of the working soft mold copying apparatus, and fixing the same by vacuum adsorption such that the support layer material is adsorbed and wrapped on an outer surface of a roller on the working soft mold copying apparatus;

adsorbing and fixing the support layer material onto a roll surface of a driving roller by using the working soft mold copying apparatus, and laying the support layer material by "progressive" line contact to cover the metal master mold coated with the pattern layer material such that they are completely attached;

by using the driving roller of the working soft mold copying apparatus, rotating the roller, moving the roller synchronously in cooperation with a working platform, and performing imprinting on the support layer by a line contact manner to complete first pressing; under the condition that the working platform does not move, performing dislocated rotation on the driving roller by a certain angle, then rotating the roller, moving the roller synchronously in cooperation with the working platform to complete subsequent pressing such that bonding between the support layer and the pattern layer is ensured and probability of producing bubble defects is reduced, and the pattern layer is thermocured and set; and by using the working soft mold copying apparatus, separating the support layer attached with the pattern layer from the metal master mold by using a "peeling" demolding manner, thereby manufacturing the double-layer composite working soft mold.

As a further limitation, during the "peeling" manner demolding, the direction when the working soft mold is separated from the metal master mold is as follows: a rotation direction of the roller is the same as the slanting direction of the metal master mold slanted grating.

As a further limitation, the support layer material is PDMS (polydimethylsiloxane), PET (polyethylene terephthalate), PC (polycarbonate) or other material with high elasticity and high transparency, and the pattern layer material is h-PDMS (hard-polydimethylsiloxane), or PDMS, or a fluoropolymer-based material with low surface energy and high elastic modulus, or ETFE (ethylene tetrafluoroethylene) or the like. A thickness of the pattern layer is 10-100 μm, and a thickness of the support layer is 100-3000 μm. The support layer is subjected to surface modification treatment or coated with a layer of a transparent coupling agent material.

As an alternative implementation, in step (4), the slanted surface-relief grating is manufactured by composite nanoimprint lithography, where during the mold covering, the mold covering direction of the working soft mold or the rotation direction of the roller is opposite to the direction of the slanted grating on the working soft mold; during the imprinting, the rotation direction of the roller is opposite to the slanting direction of the slanted grating on the working soft mold; and during the demolding, the rotation direction of the roller is the same as the direction of the slanted grating on the working soft mold.

As an alternative implementation, in step (4), the manufacturing of the slanted surface-relief grating by composite nanoimprint lithography specifically includes:

applying a layer of a liquid high-refractive-index polymer material on a high-refractive-index glass substrate, placing the glass substrate on a carrying table, and adsorbing and fixing the glass substrate coated with the imprinting material onto the carrying table by a vacuum adsorption manner; wrapping the working soft mold on an outer surface of a roller, and introducing negative pressure into an air inlet hole on a side surface of the roller by using a vacuum line to adsorb the working soft mold to the outer surface of the roller; moving the working platform horizontally to drive the carrying table to move from an initial station to an imprinting station, and enabling an imprinting mechanism to drive the roller and the working soft mold to move from an initial station to an imprinting station;

rotating the roller, sequentially switching air holes on one side from negative pressure to positive pressure, and in cooperation with the synchronous leftward horizontal movement of the working platform, laying the working soft mold onto the glass substrate coated with the imprinting material by "progressive" line contact;

driving the roller to rotate, moving the roller synchronously in cooperation with the working platform, performing imprinting on the working soft mold by a line contact manner to complete first pressing, next, under the condition that the working platform does not move, performing dislocated rotation on the roller by a certain angle, then rotating the roller, and moving the roller synchronously in cooperation with the working platform to complete subsequent pressing, where the working soft mold is in complete conformal contact with the glass substrate under the uniform pressing of the roller, and in different imprinting, the rotation direction of the roller is opposite to the slanting direction of the slanted grating on the working soft mold;

completely curing the imprinting material, where the curing manner may be UV curing, and also includes thermocuring and other curing manner; and rotating the roller, sequentially switching air holes on one side from normal pressure to negative pressure, in cooperation with the synchronous rightward horizontal movement of the working platform, and adsorbing and fixing the working soft mold onto a roll surface of the roller to be separated from the imprinting substrate in a peeling manner, where, during the demolding, the rotation direction of the roller is the same as the direction of the slanted grating on the working soft mold.

As an alternative implementation, the slanted surface-relief grating in the above method is replaced with other type of diffractive waveguide.

Secondly, an apparatus for mass production of AR diffractive waveguides is provided. The apparatus includes: a two-photon polymerization micro-nano 3D printer, a precision micro electroforming apparatus, a working soft mold copying apparatus, a composite nanoimprint lithography apparatus and a laser scriber. The apparatuses are configured to perform the corresponding steps of the method.

Compared with the prior art, the present disclosure has the following beneficial effects:

(1) Mass production of slanted surface-relief grating diffractive waveguides of any geometric shape is realized. The two-photon polymerization micro-nano 3D printing realizes fast low-cost manufacturing of the slanted surface-relief grating master of any geometric shape. The composite nanoimprint lithography is combined with the provided imprinting technique (imprinting direction and demolding direction) to solve the problem that a large-slanting-angle large-slot-depth slanted grating cannot be demolded and thus cannot be manufactured, and realize the manufacturing of the slanted grating without constraints.

(2) The present disclosure is low in production cost and high in efficiency, realizes large-scale manufacturing of the slanted surface-relief grating diffractive waveguides, and solves the technical bottleneck in mass production of slanted surface-relief grating diffractive waveguides. The two-photon polymerization micro-nano 3D printing for manufacturing the slanted surface-relief grating master is low in manufacturing cost and high in efficiency, and can also realize direct manufacturing of large-size wafer-level slanted surface-relief grating diffractive waveguides. The composite nanoimprint lithography is combined with the imprinting direction and the demolding direction to solve the problems of high production cost and low efficiency since the special structure of the slanted grating makes the soft mold to be easily damaged and short in service life in the traditional nanoimprint and demolding process.

(3) High-performance slanted surface-relief grating diffractive waveguides are manufactured. The method provided by the invention has no constraints on the design and manufacture of the slanted surface-relief gratings, and particularly can realize the manufacturing of structures of slanted surface-relief gratings of any shape and slanted gratings with a large depth-width ratio. In addition, by combining the transparent imprinting material with high refractive index, the smooth side wall and the like, the method can be used to prepare high-performance slanted surface-relief grating diffractive waveguides, and especially realizes manufacturing of large-viewing-field ultra-light ultra-thin diffractive waveguides, thereby breaking through the difficulty in manufacturing of consumer-grade AR glasses.

(4) The manufactured slanted surface-relief grating diffractive waveguides have a high yield. The composite nanoimprint lithography is combined with the provided imprint technique (during the demolding, the mold covering direction of the working soft mold (the rotation direction of the roller) is opposite to the direction of the slanted grating on the working soft mold. Thus, on the one hand, a small force can be used to ensure that the slanted grating on the working soft mold is pressed into the imprinting material, and on the other hand, the slanted grating on the working soft mold is protected, thereby avoiding the problem that the working soft mold is damaged and cannot be completely pressed into the imprinting material easily due to vertical pressing or reverse pressing (the rotation direction of the roller is the same as the slanting direction of the slanted grating). During the two-time imprinting, the rotation direction of the roller is opposite to the slanting direction of the slanted grating on the working soft mold, so that the working soft mold slanted grating can be completely filled with the imprinting material by using a very small imprinting force. On the one hand, the imprinting force is reduced, deformation of the working soft mold is reduced, and the imprinting accuracy and quality are improved; and on the other hand, the working soft mold is protected, its service life is prolonged, and especially the damage to the fragile glass substrate due to too large imprinting force can be avoided. During the curing, the soft mold is used for release, thereby ensuring the accuracy and quality of the complex. During the demolding, the soft mold is separated from the imprinting substrate in a "peeling" manner. During the demolding, the rotation direction of the roller is the same as the direction of the slanted grating on the working soft mold. The problem that the traditional nanoimprint parallel demolding cannot realize demolding of the slanted grating structure, and especially the demolding direction is the same as the direction of the slanted grating such that the working soft mold can be separated from the imprinting grating structure by using a very small demolding force. Moreover, demolding defects can be avoided, and the service life of the working soft mold is prolonged), and a variety of strategies are integrated to reduce the defects of each process step of imprinting, curing and demolding, thereby greatly improving the yield of the slanted surface-relief grating diffractive waveguides. The requirement for production of consumer-grade AR glasses is met.

(5) Single-step manufacturing of large-area (large-size) wafer-level slanted surface-relief gratings is realized.

(6) The high-efficiency low-cost mass production of the large-area nanoimprint soft molds solves the problem about low-cost fast manufacturing of wafer-level slanted surface-relief grating imprinting working molds.

(7) The present disclosure has good adaptability and high flexibility, can be used for single-piece small-lot production, and is especially suitable for mass production.

(8) The technique is simple, the equipment cost is low, and the steps can run in parallel, so the production efficiency is high.

(9) The present disclosure has very good expandability, and can meet the needs of different users.

(10) The present disclosure can be used for mass production of slanted surface-relief grating diffractive waveguides, and is also suitable for mass production of other types of diffractive waveguides (for example, nanopillar diffractive waveguides).

BRIEF DESCRIPTION OF THE DRAWINGS

The accompanying drawings constituting a part of the present disclosure are used for providing further understanding for the present disclosure. Exemplary embodiments of the present disclosure and descriptions thereof are used for explaining the present disclosure and do not constitute an improper limitation to the present disclosure.

DETAILED DESCRIPTION

The present disclosure is further described below with reference to the accompanying drawings and embodiments.

It should be noted that the following detailed descriptions are all exemplary and are intended to provide a further understanding of the present disclosure. Unless otherwise specified, all technical and scientific terms used herein have the same meaning as commonly understood by those of ordinary skill in the art to which the present disclosure belongs.

It should be noted that terms used herein are only for describing specific implementations and are not intended to limit exemplary implementations according to the present disclosure. As used herein, the singular form is intended to include the plural form, unless the context clearly indicates otherwise. In addition, it should further be understood that terms "comprise" and/or "include" used in this specification indicate that there are features, steps, operations, devices, components, and/or combinations thereof.

In the present disclosure, orientation or position relationships indicated by the terms such as "upper", "lower", "left", "right", "front", "rear", "vertical", "horizontal", "side", and "bottom" are based on orientation or position relationships shown in the accompanying drawings, are merely relationship words that are determined for ease of describing the structural relationship of components or elements of the present disclosure, and are not intended to specifically refer to any component or element in the present disclosure. Therefore, such terms should not be construed as a limitation on the present invention.

In the present disclosure, terms such as "fix", "connect", and "connection" should be understood in a broad sense. The connection may be a fixed connection, an integral connection, or a detachable connection; or the connection may be a direct connection, or an indirect connection through an intermediary. Relevant scientific research or technical personnel in the art may determine the specific meanings of the foregoing terms in the present disclosure according to specific situations, and such terms should not be construed as a limitation on the present disclosure.

Embodiment I

Figure 1B:
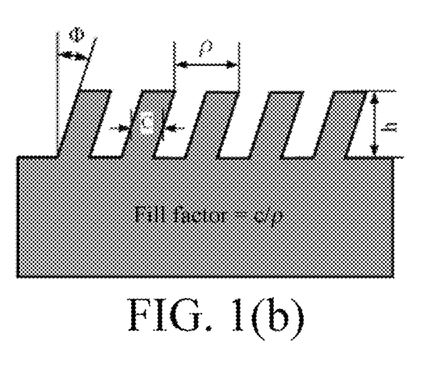

FIG. 1(a) and FIG. 1(b) show schematic diagrams of a diffractive waveguide (slanted surface-relief grating) to be manufactured. The slanting angle, slot depth (relative depth) and fill factor (grading width/period) are shown in the figures. Parameters of the slanted surface-relief grating to be manufactured by the present embodiment are as follows: slanting angle 30°; slot depth 600 nm; fill factor (coefficient) 50%.

Slanted surface-relief grating diffractive waveguides, slanted grating nano structures, and especially slanted gratings with large slanting angle and large slot depth and large-area slanted surface-relief gratings of any shape cannot be manufactured by various existing micro-nano manufacturing technologies, such as electron-beam lithography, nanoimprint, optical lithography, interference lithography, laser processing and the like. Since the existing micro-nano manufacturing technologies are based on planar micro-nano patterning (two-dimensional) processing, the nanoimprint lithography is mainly used for manufacturing 2.5-dimensional and simple three-dimensional structure, and cannot realize demolding for slanted gratings in a slanted grating nano structure (especially slanted gratings with large slanting angle and large slot depth), and the mold and the imprinted feature structure are easily damaged during the imprinting. Various existing manufacturing technologies cannot realize low-cost mass production.

In order to solve the difficulty in manufacturing slanted surface-relief gratings in the prior art and especially the problem that high-efficiency low-cost mass production of slanted surface-relief gratings cannot be realized, a method and apparatus for realizing low-cost mass production of large-area AR diffractive waveguides (slanted surface-relief gratings) of any shape by combining composite nanoimprint and micro-nano 3D printing technologies are provided. The present invention uses two-photon polymerization micro-nano 3D printing to realize manufacturing of slanted grating large-area masters of any shape (thereby solving the problem of manufacturing of slanted grating masters of any shape on the one hand, realizing direct manufacturing of large-size wafer-level masters on the other hand, and also having the advantages of low manufacturing cost and high production efficiency). The composite nanoimprint lithography technology is used (in combination with the peculiar imprint technique and the composite soft mold suitable for slanted gratings) to solve the problem that a large-slanting-angle large-slot-depth slanted grating cannot be demolded and thus cannot be manufactured, and realize the manufacturing of the slanted grating without constraints (geometric shape and size).

Taking the slanted surface-relief grating of the embodiment as an example, with reference to FIG. 2 to FIG. 9, the specific process of mass production of the slanted surface-relief gratings based on the provided method and apparatus is specifically described.

Figure 2:
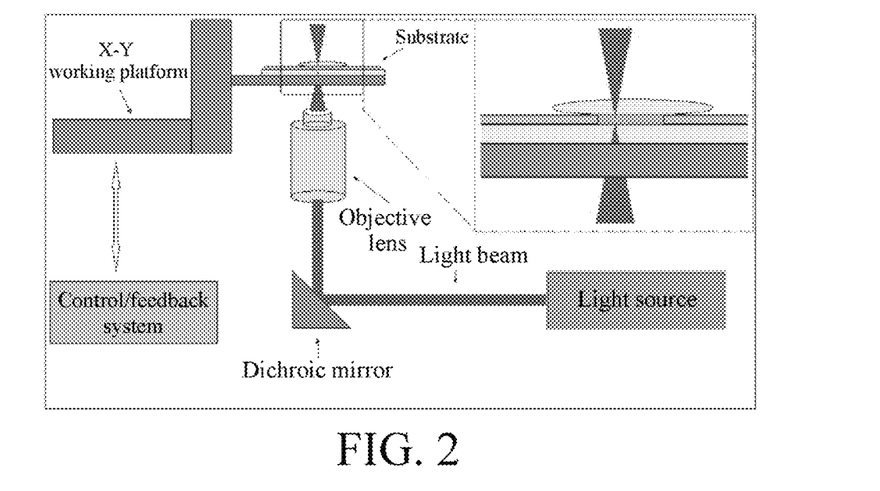
FIG. 2 shows a schematic principle diagram of a two-photon polymerization micro-nano 3D printer.
Figure 3:
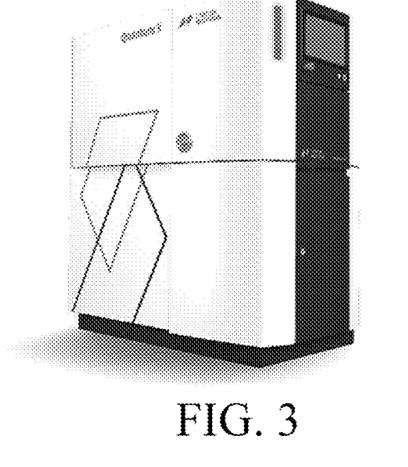
FIG. 3 shows a two-photon polymerization micro-nano 3D printer.

Step 1: Manufacturing of a Polymer Master.

A two-photon polymerization micro-nano 3D printer (Quantum X or Photonic Professional GT2 available from Nanoscribe) was used to manufacture the polymer master, the printing material was IP-G 780, and a wafer with a graphical area of 4 inches was used.

The specific technical process was as follows:

(1) Pretreatment. A geometric shape and a size of the slanted grating determined by the present embodiment were converted into a processing file by using data preprocessing software. Subsequently, the processing file was input to the two-photon polymerization micro-nano 3D printer Quantum X. The cartridge of the printer was filled with the printing material IP-G 780. The two-photon polymerization micro-nano 3D printer Quantum X was turned on.

(2) Printing of slanted grating. Layer-by-layer printing was performed according to the set printing technical parameters until the printing of the entire slanted grating was completed.

(3) After-treatment. The manufactured slanted grating model was taken off a printing platform of the two-photon polymerization micro-nano 3D printer (Quantum X printer), a supporting structure was removed, and further post-curing treatment was performed. If necessary, the after-treatment such as polishing and the like may also be performed to improve the surface quality of the slanted grating and prepare a slanted grating polymer master.

During the printing of the slanted grating, when the slanted grating structure was printed, a smaller layer thickness was used; and when the supporting structure under the slanted grating was printed, a larger layer thickness was used. The smaller layer thickness used when the slanted grating structure was printed was beneficial to improve the printing accuracy. The larger layer thickness used when the supporting structure under the slanted grating was printed was beneficial to improve the printing efficiency.

Certainly, in other embodiments, the printing material may be replaced with other materials, for example a UV-curable photoresist, a hydrogel, a nano composite resin material and the like. These replacements are easily thought of by those skilled in the art, and shall fall within the protection scope of the present disclosure.

Figure 7:
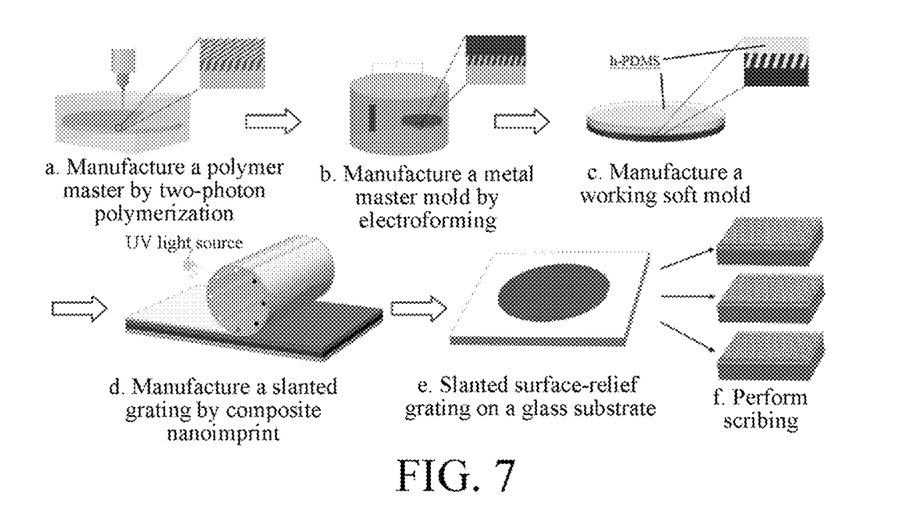
FIG. 7 shows a schematic diagram of mass production of slanted surface-relief gratings based on the provided method and apparatus.

Step 2: Manufacturing of a metal nickel master mold.

The metal master mold was a nickel master mold. Based on the IP-G 780 polymer master manufactured in step 1, a method of using a DZY-III double-slot double-channel precision electroforming machine as the micro electroforming apparatus in combination with the precision micro electroforming technique was used to manufacture the nickel master mold:

(1) Conductive treatment of polymer master. A seed layer Cr/Cu was sputter-deposited on a surface of the slanted grating polymer master by using a slanted sputtering manner. A thickness of the sputtered seed layer was 10 nm.

(2) Copying of a slanted grating nickel master mold. The slanted grating nickel master mold was copied with metal nickel with a micro electroforming precision deposition thickness of 20 μm by using a precision micro electroforming technique. A cathode stirring speed was 75 mm/s, and a circulation speed of the electroforming solution was 45 ml/min. In order to prevent the metal deposition speed from changing too fast and causing excessive internal stress, the current density was gradually increased. A temperature of the electroforming solution was 40° C., and a pH value of the electroforming solution was 3.8-4.0. A pulse current frequency was 1000 Hz.

(3) Demolding. The slanted grating nickel master mold was separated from the polymer master. The slanted grating polymer master was sequentially and gradually separated from the nickel master mold by using a peeling demolding method. If there was incomplete detachment or residual polymer structure or material, acetone, alcohol, deionized water and the like was used for repeated ultrasonic cleaning to completely remove the polymer master residual structure and material attached to the nickel master mold, and drying was performed with nitrogen. Subsequently, the nickel master mold slanted grating was subjected to surface polishing treatment to reduce the surface roughness and improve the surface quality of the slanted grating.

Certainly, in other embodiments, the above preparation technical parameters may be changed according to the specific printing requirements and environment. For example, the thickness of the sputter-deposited seed layer Cr/Cu was 5-30 nm. The thickness of the precision micro electroformed nickel was 10-300 μm.

Alternatively, in part of embodiments, each step may also be optimized. For example, the polymer master may be subjected to sensitization and activation treatment, subjected to electroless copper plating for conductive treatment, and then subjected to copper micro electroforming to manufacture the metal master mold.

The above changes are easily thought of by those skilled in the art, and shall fall within the protection scope of the present disclosure.

Figure 8:
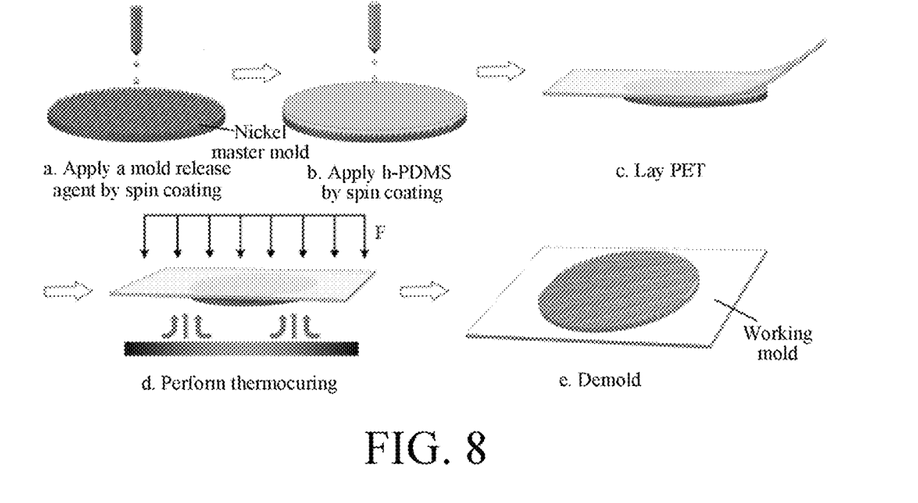
FIG. 8 shows a schematic diagram of manufacturing of a working soft mold.

Step 3: Manufacturing of a Working Soft Mold.

The working soft mold manufactured in the present embodiment: PET was used as a support layer, and the thickness was 200 μm; and h-PDMS was used as a pattern layer, and the thickness was 30 μm. Based on the metal nickel master mold manufactured in step 2, a technical process for manufacturing the working soft mold by using a working soft mold copying apparatus in combination with the provided copying technique was as follows:

(1) Pretreatment. A layer of a mold release agent was firstly applied on the metal master mold (a material of the mold release agent was $CF_3(CF_2)_7CH_2CH_2PO_2(OH)_2$, and a monomolecular-layer anti-sticking layer was deposited on the surface of the metal master mold by using a liquid deposition technique), and a liquid h-PDMS material (working soft mold pattern layer material) with a thickness of 30 μm was applied on the metal master mold by using a spin coating technique. The metal master mold coated with the h-PDMS was placed on a carrying table of the working soft mold copying apparatus, and was fixed by vacuum adsorption. The PET with a thickness of 200 μm (working soft mold support layer material) was adsorbed and wrapped on an outer surface of a roller on the working soft mold copying apparatus.

(2) Copying of a PET/h-PDMS working soft mold. i. By using the working soft mold copying apparatus, the PET (adsorbed and fixed onto a roll surface of a driving roller) was laid by "progressive" line contact to cover the metal master mold coated with the h-PDMS, thereby avoiding bubbles generated between the PET and the h-PDMS, such that they were completely attached (before the attachment, the surface of the PET may be plasma-bombarded to improve the adhesion between the PET and the h-PDMS). ii. By using the driving roller of the working soft mold copying apparatus, the roller rotated and moved synchronously in cooperation with the working platform, and imprinting was performed on the support layer PET by a line contact manner to complete first pressing. Next, under the condition that the working platform did not move, dislocated rotation by 30° was performed on the driving roller, then the roller rotated and moved synchronously in cooperation with the working platform to complete secondary pressing such that bonding between the PET and the h-PDMS was ensured and probability of producing bubble defects was reduced. iii. A heating module of the carrying table was turned on such that the h-PDMS was thermocured. The thermocuring temperature was 80° C., and the curing time was 2 hours to ensure that the h-PDMS was completed cured and set.

(3) Demolding. The heating module was turned off. The PET attached with the h-PDMS was separated from the metal master mold by using the working soft mold copying apparatus in combination with the "peeling" manner. During the "peeling" demolding, the working soft mold (PET/h-PDMS) was separated from the metal master mold in the following direction: the rotation direction of the roller was the same as the slanting direction of the metal master mold slanted grating. The advantages of the "peeling" demolding of the working soft mold copying apparatus were fully utilized to realize manufacturing of the large-area large-slanting-angle large-slot-depth grating. The double-layer composite working soft mold was manufactured.

Certainly, in other embodiments, the above preparation technical parameters may be changed according to the specific printing requirements and environment. For example, the change of the dislocation angle, or the change of the thickness of the material or the like.

The following conditions needed to be satisfied:

The manufactured working soft mold was a transparent thin-film composite soft mold including a pattern layer and a support layer. The pattern layer was located on the support layer, and the pattern layer included the micro-nano feature structure to be copied. The pattern layer had the characteristics of extremely low surface energy and high elastic modulus and was transparent, and the support layer was transparent, had the characteristic of high flexibility, and was of a thin-film structure.

The pattern layer may use h-PDMS, or PDMS, or a fluoropolymer-based material with low surface energy and high elastic modulus, or ETFE or the like.

The support layer may use PDMS, PET, PC and other material with high elasticity and high transparency.

A thickness of the pattern layer was 10-100 and a thickness of the support layer was 100-3000 μm. The support layer was subjected to surface modification treatment or coated with a layer of a transparent coupling agent material.

Figure 9:
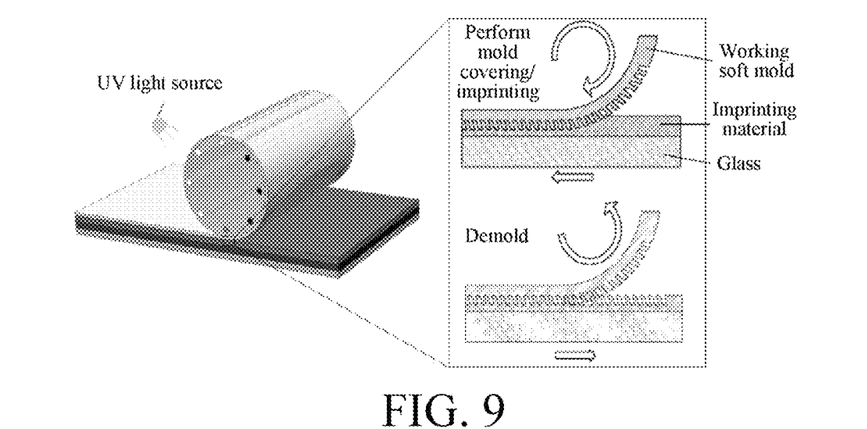
FIG. 9 shows a schematic diagram of manufacturing of a slanted surface-relief grating by imprinting.

Step 4: Manufacturing of a Slanted Surface-Relief Grating.

Figure 4:
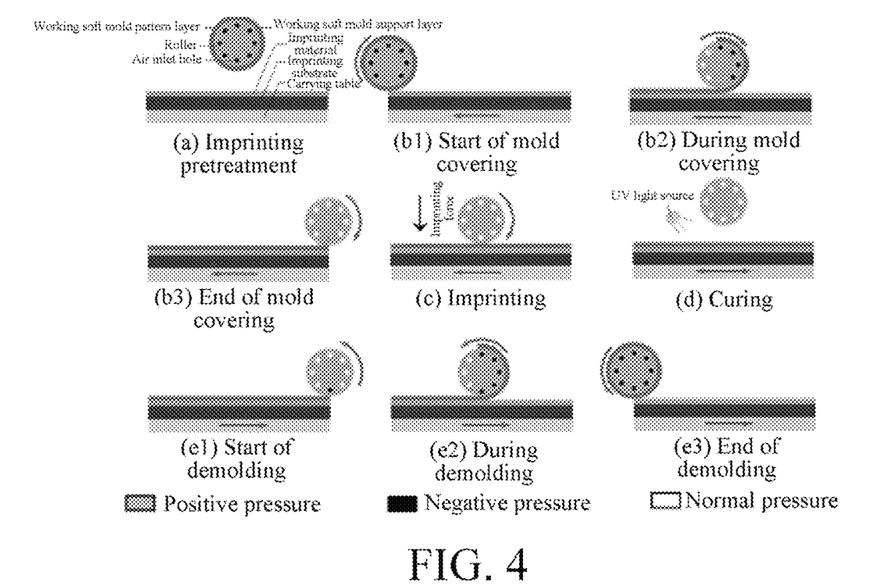
FIG. 4 shows a schematic principle diagram of composite nanoimprint lithography.
Figure 5:
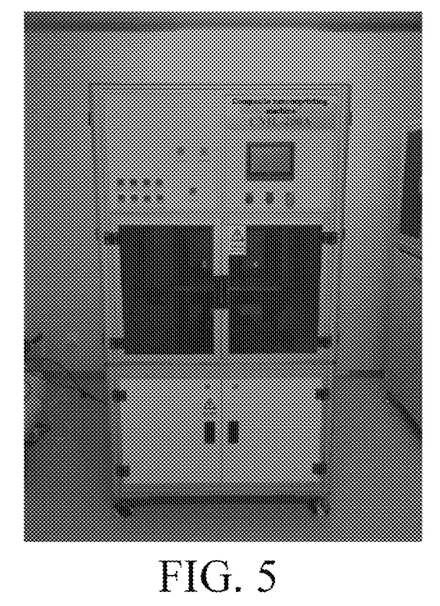
FIG. 5 shows a composite nanoimprint lithography machine.
Figure 6:
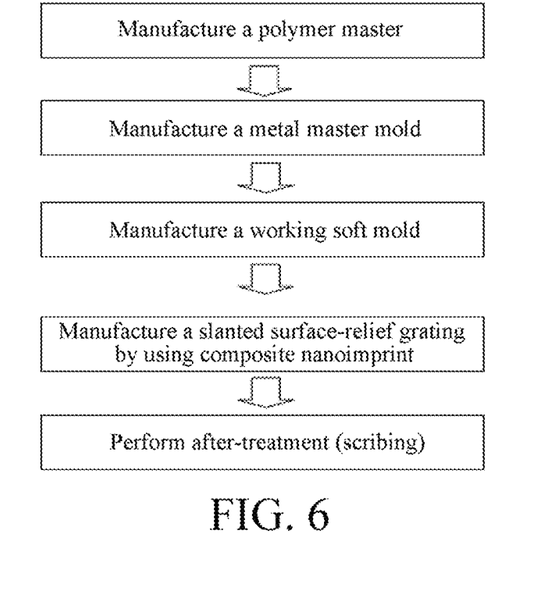
FIG. 6 shows a flow chart of mass production of AR diffractive waveguides based on the provided method and apparatus.

The method of manufacturing the slanted surface-relief grating by using the composite nanoimprint lithography machine in combination with the provided imprinting technique and the optimized technical parameters was as follows:

(1) Pretreatment. The diffractive waveguide substrate was a SCHOTT RealView ultra-flat high-refractive-index glass wafer available from SCHOTT with a refractive index of 1.9, and the size of the substrate was 4 inches. A 1000 nm low-viscosity fast-photocuring transparent high-refractive-index polymer material was applied on the 4-inch glass wafer (substrate) by spin coating, the glass substrate was placed on the carrying table, and the glass substrate coated with the polymer imprinting material was adsorbed and fixed onto the carrying table by a vacuum adsorption manner. The working soft mold PET/h-PDMS was wrapped on the outer surface of the roller, and negative pressure was introduced into an air inlet hole on a side surface of the roller by using a vacuum line to adsorb the working soft mold PET/h-PDMS to the outer surface of the roller. The working platform moved horizontally to drive the carrying table to move from an initial station to an imprinting station, and an imprinting mechanism drove the roller and the working soft mold PET/h-PDMS to move from an initial station to an imprinting station.

(2) Mold covering. The roller rotated and air holes on one side were sequentially switched from negative pressure to positive pressure (changed into normal pressure after a slight delay), and in cooperation with the synchronous leftward horizontal movement of the working platform, the working soft mold PET/h-PDMS (initially adsorbed and fixed on the roll surface of the driving roller) was laid onto the glass substrate coated with the polymer imprinting material by "progressive" line contact. The line contact manner reduced the probability of producing large-area imprinting bubble defects, and even eliminated the bubbles. The mold covering direction of the working soft mold PET/h-PDMS (the rotation direction of the roller) was opposite to the direction (slanting angle) of the slanted grating on the working soft mold PET/h-PDMS. Thus, on the one hand, a small force can be used to ensure that the slanted grating on the working soft mold PET/h-PDMS is pressed into the polymer imprinting material, and on the other hand, the slanted grating on the working soft mold PET/h-PDMS was protected, thereby avoiding the problem that the working soft mold PET/h-PDMS was damaged and cannot be completely pressed into the imprinting polymer material easily due to vertical pressing or reverse pressing (the rotation direction of the roller was the same as the slanting direction of the slanted grating).

(3) Imprinting. The roller rotated and moved synchronously in cooperation with the working platform, and imprinting was performed on the working soft mold PET/h-PDMS by a line contact manner to complete the first pressing. Next, under the condition that the working platform did not move, dislocated rotation by 20° was performed on the roller and then the roller rotated and moved synchronously in cooperation with the working platform to complete the secondary pressing (during the imprinting, the adsorption slot on the roll surface of the driving roller may cause the imprinting force between the adsorption slot and the working soft mold PET/h-PDMS to be too small, so in order to ensure the uniform imprinting force, the method of performing dislocated rotation on the roller was used for secondary imprinting to reduce the adverse effects caused by the adsorption slot), and the working soft mold PET/h-PDMS was in complete conformal contact with the glass substrate under the uniform pressing of the roller. During the two-time imprinting, the rotation direction of the roller was opposite to the slanting direction of the slanted grating on the working soft mold, so that the working soft mold slanted grating can be completely filled with the imprinting material by using a very small imprinting force. On the one hand, the imprinting force was reduced, deformation of the working soft mold was reduced, and the imprinting accuracy and quality were improved; and on the other hand, the working soft mold PET/h-PDMS was protected, its service life was prolonged, and especially the damage to the fragile glass substrate due to too large imprinting force can be avoided.

(4) Curing. After the pressing of the roller on the working soft mold PET/h-PDMS was completed, the roller was lifted up by 800 μm, a UV light source was turned on, the working platform performed 3 back-and-forth movements, and the UV polymer imprinting material was completely cured.

(5) Demolding. The roller rotated and air holes on one side were sequentially switched from normal pressure to negative pressure, and in cooperation with the synchronous rightward horizontal movement of the working platform, the working soft mold PET/h-PDMS was gradually adsorbed and fixed onto the roll surface of the roller to be separated from the glass substrate in a peeling manner. During the demolding, the rotation direction of the roller was the same as the direction of the slanted grating on the working soft mold PET/h-PDMS. The problem that the traditional nanoimprint parallel demolding cannot realize demolding of the slanted grating structure was solved, and especially the demolding direction was the same as the direction of the slanted grating such that the working soft mold can be separated from the imprinting grating structure by using a very small demolding force. Moreover, demolding defects can be avoided, and the service life of the working soft mold was prolonged.

Similarly, the various technical parameters of step 4 may be changed according to the specific printing requirements and situation. These changes are easily thought of by those skilled in the art, and shall fall within the protection scope of the present disclosure.

It should be noted that, in order to obtain better effects, step 4 has better effects in the following manner:

The imprinting material was a transparent high-refractive-index polymer material, preferably a low-viscosity fast-photocuring transparent high-refractive-index polymer material, and also included a transparent high-refractive-index inorganic polymer material, a glass precursor or the like.

The imprinting force was in a range of 50-500 N.

The curing also included thermocuring and other curing manner.

Step 5: After-treatment.

The wafer-level slanted surface-relief grating manufactured in step 4 was cut into the slanted surface-relief grating required for single AR glasses by laser scribing technology, thereby completing manufacturing of the AR diffractive waveguide.

The above five steps were performed in sequence.

The horizontal movement speed of the working platform, the rotation speed of the adsorption roller, and the times of sequentially switching positive and negative pressure of the air inlet holes of the adsorption roller need to be kept in strict synchronization.

The movement speed of the working platform was 10 mm/s, and the rotation linear speed of the adsorption roller was 10 mm/s. The UV-LED linear light source curing device had a power of 1000 W and a wavelength of 365 nm.

In the manufacturing of the metal nickel master mold in step 2, a support back plate was grown by micro electroforming.

In order to reduce the problem of bending of the metal nickel master mold due to residual internal stress, the manufactured metal nickel master mold was subjected to stress relief after-treatment. Vacuum annealing was performed at a temperature of 400° C. for 2 hours, and the annealed metal nickel master mold was cooled in the furnace to room temperature. The internal stress of the annealed nickel master mold was greatly reduced, and the master mold became flat and suitable for imprinting.

Embodiment II

The difference from Embodiment I was that technical parameters of each step can be changed. At the same time, after a first production cycle was completed, step 1, step 2 and step 3, and step 4 and step 5 ran in parallel.

Embodiment III

The difference from Embodiment I was that technical parameters of each step can be changed. At the same time, step 1, step 2 and step 3 were implemented in series in advance.

The actual steps only included step 4 and step 5, which ran sequentially.

The apparatus used in the above embodiments mainly includes: a two-photon polymerization micro-nano 3D printer; a precision micro electroforming apparatus; a working soft mold copying apparatus; a composite nanoimprint lithography apparatus; and a laser scriber and the like.

The foregoing descriptions are merely preferred embodiments of the present disclosure, but are not intended to limit the present disclosure. A person skilled in the art may make various alterations and variations to the present disclosure. Any modification, equivalent replacement, or improvement made without departing from the spirit and principle of the present disclosure shall fall within the protection scope of the present disclosure.

The specific implementations of the present disclosure are described above with reference to the accompanying drawings, but are not intended to limit the protection scope of the present disclosure. Those skilled in the art should understand that various modifications or deformations may be made without creative efforts based on the technical solutions of the present disclosure, and such modifications or deformations shall fall within the protection scope of the present disclosure.

What is claimed is:

1. A method for production of AR diffractive waveguides, comprising the following steps:
   (1) manufacturing a polymer master by using two-photon polymerization micro-nano 3D printing;
   (2) manufacturing a slanted grating metal nickel master mold by using the polymer master manufactured in step (1) in combination with precision micro electroforming technology;
   (3) manufacturing of a working soft mold by determining a support layer material and a pattern layer material, and using a working soft mold copying apparatus to perform copying of the working soft mold by using the slanted grating metal nickel master mold manufactured in step (2) as a mold;
   (4) manufacturing of a slanted surface-relief grating structure by composite nanoimprint lithography by selecting an imprinting material and an imprinting substrate, using the working soft mold prepared in step (3) as an imprinting mold, and using composite nanoimprint technology, wherein
      during mold covering, a rotation direction of a roller releasing the working soft mold being opposite to a direction of a slanted surface-relief grating on the working soft mold is ensured such that the slanted surface-relief grating structure is imprinted, transferred and copied onto the imprinting material forwardly;
      during imprinting, two-time imprinting is used, and a rotation direction of the roller during the two-time imprinting is opposite to the direction of the slanted surface-relief grating on the working soft mold;
      during demolding, "peeling" demolding is used, and a rotation direction of the roller grasping the working soft mold is the same as the direction of the slanted surface-relief grating on the working soft mold, thereby completing manufacturing of the slanted surface-relief grating structure on the imprinting substrate; and
   (5) cutting the slanted surface-relief grating structure that has been manufactured into a required slanted surface-relief grating required for AR glasses by laser scribing technology, thereby completing manufacturing of the AR diffractive waveguides,
   wherein in step (3), the copying of the working soft mold comprises:
      first applying a layer of a mold release agent to the slanted grating metal nickel metal master mold, then applying a liquid layer of the pattern layer material by using a precision coating manner, placing the slanted grating metal nickel metal master mold coated with the pattern layer material on a carrying table of the working soft mold copying apparatus, and fixing the slanted grating metal nickel metal master mold coated with the pattern layer material by vacuum adsorption;
      adsorbing and fixing the support layer material onto the outer surface of the roller by using the working soft mold copying apparatus, and laying the support layer material by progressive line contact to cover the slanted grating metal nickel metal master mold coated with the pattern layer material such that the support layer material and the pattern layer material are completely attached;
      by using the roller of the working soft mold copying apparatus, rotating the roller, moving the roller synchronously in cooperation with a working platform, and performing imprinting on the support layer by a line contact manner to complete first pressing; under a condition that the working platform does not move, performing dislocated rotation on the roller by a certain angle, then rotating the roller, moving the roller synchronously in cooperation with the working platform to complete subsequent pressing such that bonding between the support layer and the pattern layer is ensured and probability of producing bubble defects is reduced, and the pattern layer is thermocured and set; and
      by using the working soft mold copying apparatus, separating the support layer attached with the pattern layer from the slanted grating metal nickel metal master mold by using a peeling manner, thereby manufacturing the working soft mold in a form of double-layer composite.

2. The method according to claim 1, wherein after a first production cycle is completed, step (1), step (2) and step (3), and step (4) and step (5) run in parallel;
   or/and, step (1), step (2) and step (3) are in serial production; and step (4) and step (5) are in serial production.

3. The method according to claim 1, wherein step (1) comprises: converting a geometric shape and a size of a slanted grating into a processing file by using data processing software; subsequently, inputting the processing file to a two-photon polymerization micro-nano 3D printer; performing layer-by-layer printing according to design data until the printing of the slanted grating is completed; and taking the slanted grating that has been manufactured off a printing platform of the printer, removing a supporting structure, and further performing post-curing treatment to prepare the polymer master of the slanted grating.

4. The method according to claim 1, wherein step (2) comprises:
sputter-depositing a seed layer Cr/Cu on a surface of the polymer master by using a slanted sputtering manner;
forming and copying the slanted grating metal nickel master mold by using a precision micro electroforming technique; and
separating the slanted grating metal nickel master mold from the polymer master, completely removing residual structure and material of the polymer master attached to the slanted grating nickel master mold, and performing surface treatment on a slanted grating of the slanted grating nickel master mold to reduce surface roughness and improve surface quality of the slanted grating.

5. The method according to claim 1, wherein in step (3) during the demolding, a direction relationship when the working soft mold is separated from the slanted grating metal nickel metal master mold is as follows: a rotation direction of the roller is the same as the a slanting direction of the slanted grating metal nickel master mold.

6. The method claim 1, wherein
the support layer material is PDMS, PET or PC; or
the pattern layer material is h-PDMS, PDMS, a fluoropolymer-based material, or ETFE; or
a thickness of the pattern layer is in a range of 10-100 m, and a thickness of the support layer is in a range of 100-3000 μm; or
the support layer is subjected to surface modification treatment or coated with a layer of a transparent coupling agent material.

7. The method according to claim 1, wherein in step (4) during the imprinting, the imprinting is performed on the working soft mold by a line contact manner to complete a first pressing; subsequently, dislocated rotation is performed on the roller, and the roller is rotated and synchronously moves in cooperation with a working platform to complete a second pressing imprinting; and during curing, the roller is lifted up by a certain height to ensure that the roller is detached from the working soft mold, the working platform performs one or more back-and-forth movements, and the imprinting material is completely cured.

8. A method for production of AR diffractive waveguides, comprising the following steps:
(1) manufacturing a polymer master by using two-photon polymerization micro-nano 3D printing;
(2) manufacturing a slanted grating metal nickel master mold by using the polymer master manufactured in step (1) in combination with precision micro electroforming technology;
(3) manufacturing of a working soft mold by determining a support layer material and a pattern layer material, and using a working soft mold copying apparatus to perform copying of the working soft mold by using the slanted grating metal nickel master mold manufactured in step (2) as a mold;
(4) manufacturing of a slanted surface-relief grating structure by composite nanoimprint lithography by selecting an imprinting material and an imprinting substrate, using the working soft mold prepared in step (3) as an imprinting mold, and using composite nanoimprint technology, wherein
during mold covering, a rotation direction of a roller releasing the working soft mold being opposite to a direction of a slanted surface-relief grating on the working soft mold is ensured such that the slanted surface-relief grating structure is imprinted, transferred and copied onto the imprinting material forwardly;
during imprinting, two-time imprinting is used, and a rotation direction of the roller during the two-time imprinting is opposite to the direction of the slanted surface-relief grating on the working soft mold;
during demolding, "peeling" demolding is used, and a rotation direction of the roller grasping the working soft mold is the same as the direction of the slanted surface-relief grating on the working soft mold, thereby completing manufacturing of the slanted surface-relief grating structure on the imprinting substrate; and
(5) cutting the slanted surface-relief grating structure that has been manufactured into a required slanted surface-relief grating required for AR glasses by laser scribing technology, thereby completing manufacturing of the AR diffractive waveguides,
wherein in step (4), the manufacturing of the slanted surface-relief grating by composite nanoimprint lithography comprises: applying a layer of a liquid polymer material as the imprinting material on a glass substrate as the imprinting substrate, placing the glass substrate on a carrying table, and adsorbing and fixing the glass substrate coated with the imprinting material on the carrying table by a vacuum adsorption manner; wrapping the working soft mold on an outer surface of the roller, and introducing negative pressure to a plurality of air holes on the outer surface of the roller by using a vacuum line to adsorb the working soft mold to the outer surface of the roller; moving a working platform horizontally to drive the carrying table to move from an initial station to an imprinting station, and enabling an imprinting mechanism to drive the roller and the working soft mold to move from the initial station to the imprinting station; rotating the roller, sequentially switching the air holes on one side from negative pressure to positive pressure, and in cooperation with a synchronous leftward horizontal movement of the working platform, laying the working soft mold onto the glass substrate coated with the imprinting material by "progressive" line contact; driving the roller to rotate, moving the roller synchronously in cooperation with the working platform, performing imprinting on the working soft mold by a line contact manner to complete first pressing, next, under a condition that the working platform does not move, performing dislocated rotation on the roller by a certain angle resulting in the air holes on the outer surface of the roller being dislocated, then rotating the roller, and moving the roller synchronously in cooperation with the working platform to complete subsequent pressing, wherein the working soft mold is in complete conformal contact with the glass substrate under uniform pressing of the roller; completely curing the imprinting material; and rotating the roller, sequentially switching the air holes on one side from normal pressure to negative pressure, in cooperation with a synchronous rightward horizontal movement of the working platform, and adsorbing and fixing the working soft mold onto the outer surface of the roller to be separated from the imprinting material on the imprinting substrate in a peeling manner.

* * * * *